United States Patent [19]

Westwick

[11] Patent Number: 5,160,894
[45] Date of Patent: Nov. 3, 1992

[54] DIGITAL FREQUENCY SYNTHESIZER AND METHOD OF FREQUENCY SYNTHESIS

[75] Inventor: Alan L. Westwick, Austin, Tex.

[73] Assignee: Motorola, Inc., Schaumburg, Ill.

[21] Appl. No.: 822,224

[22] Filed: Jan. 17, 1992

[51] Int. Cl.$^5$ .......................................... H03B 19/00
[52] U.S. Cl. ...................................... 328/14; 307/529
[58] Field of Search ................. 328/14, 15, 16, 129.1; 307/271, 529; 377/55, 20

[56] References Cited

U.S. PATENT DOCUMENTS 5,054,039 10/1991 Blackmon et al. ..................... 328/14
5,095,279 3/1992 Quan et al. ............................ 328/14

*Primary Examiner*—William L. Sikes
*Assistant Examiner*—Sinh Tran
*Attorney, Agent, or Firm*—Robert L. King

[57] ABSTRACT

A frequency synthesizer circuit (10). Circuit (10) has a counter (12), a latch/decoder (14), a divider (16), and an optional wave shaper (18) which synthesize an output clock signal X. Counter (12) counts a number of clock signal N periods that occur within one clock signal M period and this count is stored as a count value. The count value is latched and/or decoded by the latch/decoder (14) to produce a divisor which is output from the latch/decoder (14) to the divider (16). The divider (16) divides a clock signal N frequency by the divisor to provide a spiked waveform to the wave shaper (18). The wave shaper (18) alters a frequency and/or a duty cycle of the spiked waveform to produce the clock signal X. Clock signal X has a substantially constant frequency regardless of the clock signal N frequency or operational variation in the system clock N frequency.

20 Claims, 2 Drawing Sheets

DIGITAL FREQUENCY SYNTHESIZER AND METHOD OF FREQUENCY SYNTHESIS

FIELD OF THE INVENTION

The present invention relates generally to electronic digital systems, and more particularly, to digital frequency synthesis.

BACKGROUND OF THE INVENTION

Modern microprocessors or integrated circuits, due to increased complexity and functionality, are requiring more clocks and cyclic control signals than their predecessors. In order to achieve multiple clocks in a microprocessor system, many microprocessors internally synthesize additional clocks from one or more system clocks that are input to the microprocessor from circuitry external to the microprocessor. A quick, inexpensive, reliable, and simple solution to the internal generation of clocks has not been achieved.

A simple approach to supplying a microprocessor with several clocks is to input several clocks into the microprocessor. This technique is not reliable and can be very expensive. The added expense is due to the fact that extra pins must be added to the microprocessor's package, and external circuitry, which may have several crystal oscillators, is required. When microprocessor operation is closely dependent on the ration of one clock frequency to another, such as in transceiver applications, data converter applications, and sample-data filter applications, this method is not adequate.

Another method is to simply divide an input system clock by a single fixed divisor using dividing circuitry. This method can only divide the system clock by a fixed value and therefore cannot be used for multiple system clock frequencies or to adapt to operational variation in system clock frequency without altering the frequency of the synthesized clock.

To improve upon the methods above, a method of using a programmable divider circuit internal to the microprocessor was adopted. User input, either through software or hardware, programs the programmable divider circuit to divide the input system clock by a specific value. This division produces an internal synthesized clock. This method requires user input and is therefore subject to error resulting from incorrect data being input by a user. This method is also not flexible because the divider cannot usually compensate itself for errors, fluctuation, or alteration in the frequency of the system clock without user intervention. An additional disadvantage is that the divider, and therefore the synthesized clock, is not functional after reset or power up until the user programs the divider.

Yet another method of supplying a microprocessor with several clocks is to store or provide internal to the microprocessor a plurality of divisors. The plurality of divisors is usually stored or provided with some indication of numerical order. The microprocessor is informed, usually through fixed hardware comparators, of a desired synthesized frequency for the synthesized clock. The hardware, upon reset, power-up or a like condition, begins to scan through all the stored or provided divisor values until one divisor produces a synthesized clock with a frequency substantially close to the desired synthesized frequency. Although this method allows for errors and alterations in the system clock, it is slow and requires a large amount of overhead in order to be accurate.

Yet another method to generate internal clocks is to use an analog phase lock loop circuit. A phase lock loop circuit uses analog circuitry and a reference clock, which is the system clock in most cases, to converge a synthesized clock value to a predetermined frequency via multiplication, division, and/or comparison. Phase lock loops, due to their analog components, are usually slow to converge, are unreliable, and are inherently unstable.

SUMMARY OF THE INVENTION

The previously mentioned disadvantages are overcome and other advantages achieved with the present invention. The present invention comprises a frequency synthesizer and method of frequency synthesis. In one form, the frequency synthesizer has a counter having a reference clock input for receiving a reference clock signal, a system clock input for receiving a system clock signal which is externally controlled to be within a predetermined range of frequencies greater than a frequency of the reference clock signal, and an output for providing a count output signal. Means for storing a predetermined portion of the count output signal is coupled to the counter. Means for dividing the system clock by a divisor determined by the predetermined portion of the count output signal is coupled to the counter. The means for dividing is used to provide a synthesized output frequency signal of predetermined constant frequency regardless of variation of the system clock within the predetermined range of frequencies.

The present invention will be more clearly understood from the detailed description below in conjunction with the accompanying drawings.

DESCRIPTION OF THE PREFERRED EMBODIMENT

Figure 1:
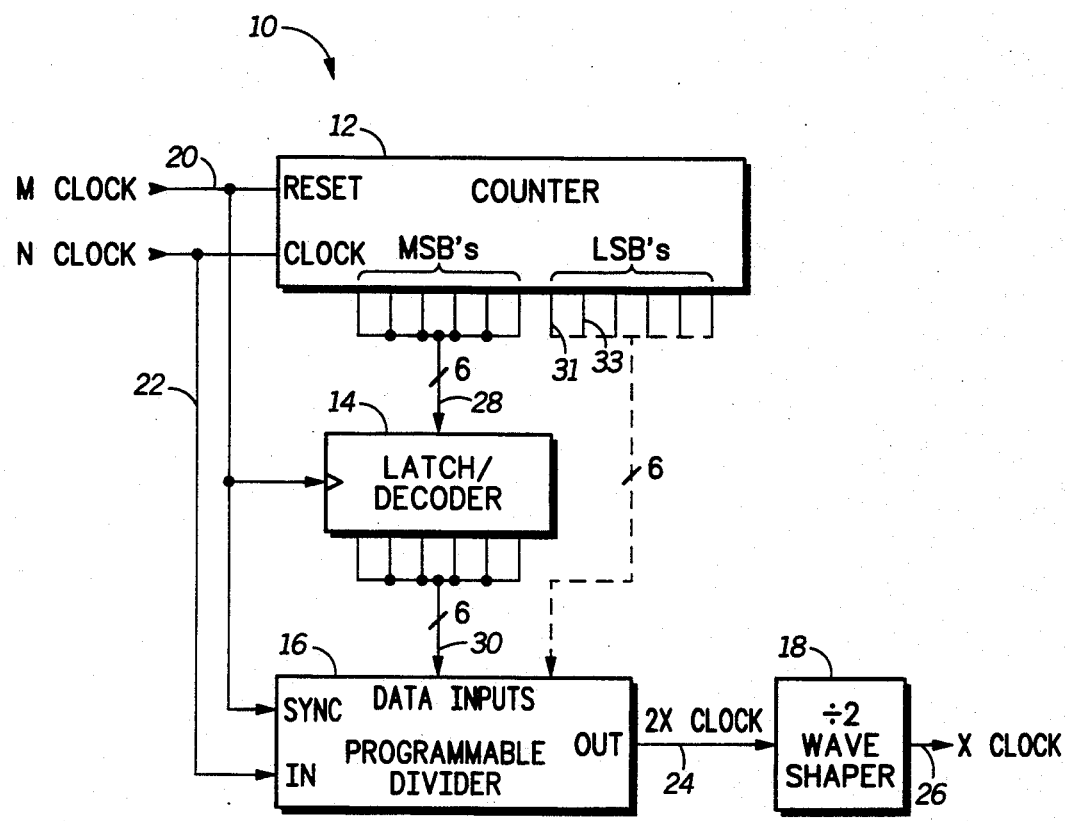
FIG. 1 illustrates, in block diagram form, a frequency synthesizer in accordance with the present invention.

Illustrated in FIG. 1 is a frequency synthesizer referred to as a circuit 10. Circuit 10 has a counter 12 which is, in one form, a twelve-bit counter. Although a twelve bit counter is illustrated, any bit-size counter can be used. In addition, the counter 12 is preferably a ripple counter but other known counter circuits can be used. The counter 12 has a reference clock input conductor 20 which receives a reference clock signal M, a system clock input conductor 22 which receives a system clock signal N, and an output 28. System clock signal N may be one of any frequency within a predetermined range of frequencies and have operational variation. Output 28 provides a count output signal which is a binary value. Output 28 has Y bit lines where Y is between one and the bit-size of the counter. Output 28 is, as illustrated, the top six most significant bits (MSBs) of the counter 12.

Output 28 is connected to a latch/decoder 14. In most cases, latch/decoder 14 is a latch, register, or an alterable memory circuit that stores the count output signal or a predetermined portion of the count output signal which is provided by output 28. Latch/decoder 14 has an output 30 which has Z bits where Z can be any number. Output 30 provides a divisor value. In the illustrated form where Y equals six bit lines and the latch/decoder 14 acts only as a latching device, Z equals Y and therefore Z is six. Latch/decoder 14 has an input connected to conductor 20 for receiving the reference clock signal M.

Output 30 is connected to a programmable divider 16. Divider 16 is, in the illustrated form, a down counter with added features. Any divider circuit capable of dividing a clock signal by a digitally-provided divisor may be used for divider 16. Divider 16 has an input conductor 22 for receiving system clock N and a synchronizing input for receiving clock M via conductor 20. An output of programmable divider 16 provides a clock signal labeled 2X via an output conductor 24.

Output conductor 24 is connected to a wave shaper 18. Wave shaper 18 has an output for providing a clock signal X via an output conductor 26. Clock signal X is a synthesized output frequency signal of predetermined constant frequency regardless of variation in the system clock signal N. In the illustrated form, the wave shaper 18 transforms clock signal 2X into a 50% duty cycle square wave. In the process of this duty cycle transformation, the wave shaper 18 divides the frequency of the clock signal 2X by two, although this division is optional. In one form, a D flip-flop (DFF) is used to perform the wave shaping function, but other analog and digital methods of wave shaping and duty cycle altering exist.

Figure 2:
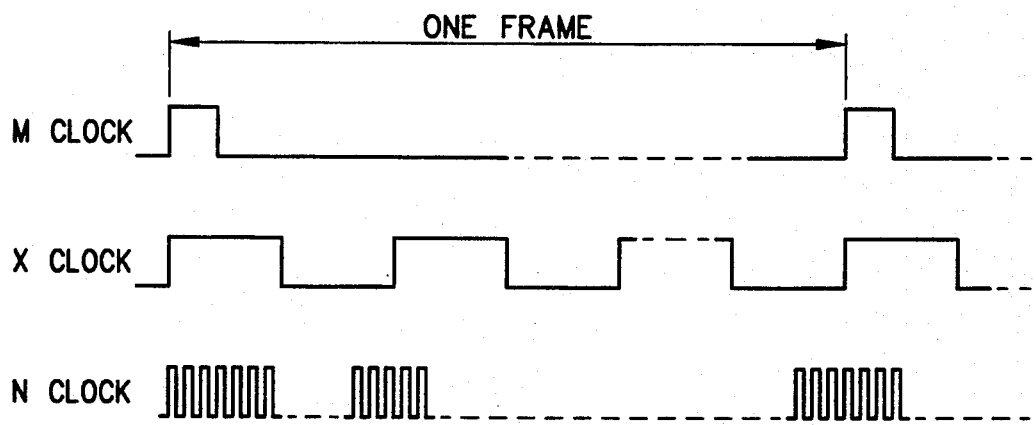
FIG. 2 illustrates, in a timing diagram, clock signals associated with the frequency synthesizer of FIG. 1.

FIG. 2 illustrates sample operational frequencies of clock M, clock signal N, and clock signal X. Other frequencies are possible. In one form, clock signal M operates at 8 KHz and is provided to circuit 10 via input conductor 20. Clock signal M can be a physically and electrically distinct clock from clock signal N, or clock signal M may be derived from the system clock signal N via a divider circuit similar to divider 16. Clock signal N is the system clock and will usually operate at one predetermined frequency. The frequency of clock signal N may be fixed as any frequency within a range from 1 MHz to 33 MHz for most applications. For some applications, frequencies much higher than 33 MHz are possible. Clock signal N is provided via input conductor 22 to the circuit 10 from an external source (not illustrated) which usually involves conventional crystal oscillator technology. The illustrated circuit 10 of FIG. 1 accepts as inputs the waveforms and frequencies of the clock signals M, X, and N that are illustrated in FIG. 2.

Referring back to FIG. 1, the counter 12 is illustrated as a twelve-bit counter. In general, counter 12 is used to count a number of periods of clock signal N that occurs within one period of clock signal M. Another way in which to view this calculation is that the counter 12 calculates N divided by M. First, the counter 12 is cleared to zero or a predetermined reset value. In some cases, a reset of counter 12 may be slow and result in a loss of a few counts of the clock signal N. An exact count of the periods of the clock signal N is required, therefore a loss of count during reset is readily fixed by presetting the counter to the lost number of counts. For example, if it is determined that three periods or oscillations of clock signal N occur during the reset of counter 12, then three counts are always lost after reset. To compensate for the lost count value, the counter is not reset to zero but is reset to a count of three. In some cases, a reset of counter 12 to a count of three is called presetting the counter to a value of three. For counters with a fast reset time, a preset is not needed.

Upon reset, which is triggered by a beginning of a period of the 8 KHz clock signal M, the counter 12 begins to increment for each period of clock signal N. For our example where M=8 KHz and N=20.48 MHz, the counter value at the end of one period of clock signal M is N/M=2560 counts. Upon completing a period of clock signal M and counting to the count output signal of 2560, a portion of the value 2560 is available via the output 28 of the counter. The clock signal M then resets the counter 12 for another count and simultaneously latches the value of the count output signal or a predetermined portion of the count output signal into the latch/decoder 14. In FIG. 1, the six most significant bits (MSBs) of the counter 12 are latched into the latch/decoder 14. Therefore, out of the available count output signal, which is 2560, only the value 40 is latched (40=2560/64 because removal of the six lower bits acts as a divide by $2^6$). This procedure of counting via the counter 12, latching into the latch/decoder 14, and resetting the counter 12 continues as long as the clock signal M is present.

The latch/decoder 14 is, in a preferred embodiment, a latch that stores the value of a group of MSBs from the counter 12. Because of the fact that the latch/decoder 14 is in most cases a latch or a similar storage device, the output 30 is equal to the output 28. Therefore, the output 30 carries a value of 40 as well. The output 30 functions as a carrier for a divisor value. Additional and more complex decoding capabilities of the latch/decoder 14 will be discussed in following paragraphs.

Once latch/decoder 14 has latched the divisor value, the divider 16 has the ability to produce a valid synthesized clock 2X. The divider, when implemented as a down-counter will minimize much overhead. It is important to note that other waveform dividing methods do exist and will function properly in this application. The divider 16 is loaded with the divisor, which for the current example is 40. Every period of the clock signal N decrements the divisor value stored in the divider 16 by one. Once the divider 16 reaches a stored divisor value of zero, the output conductor 24 of the divider 16 is toggled producing a spiked output waveform that has a frequency of 512 KHz for this example (2X=20.48 MHz/40). The frequency of the clock signal 2X, 512 KHz, is twice the frequency of the desired output signal X and is therefore referred to as 2X. Circuit 10 has been wired to have a clock signal X of 256 KHz regardless of frequency variation in clock signal N.

It is important to note that the signal 2X, or output conductor 24, may itself be used as an output synthesized clock without the use of the wave shaper 18. The divider 16 can also be programmed to produce a 50% duty cycle output at conductor 24 instead of a spiked output waveform by using a simple divide by two technique on the divisor value and using known logic (not illustrated) to determine the output state (zero or one).

The divider 16 repeats the steps of reloading the divisor value and decrementing the divisor value to zero as long as the system clock signal N is present.

Although the possibility of eliminating the wave shaper 18 and integrating wave shaping functionality into the divider 16 is presented herein, a separate wave shaper 18 is useful for many applications. The wave shaper 18 receives the spiked output waveform of divider 16 via output conductor 24. Every "spike" of the spiked output waveform causes a flip-flop in the wave shaper 18 to change state from a logic high to a logic low or vice versa. This oscillation creates an output clock signal X with a frequency of 256 KHz and a duty cycle of 50%.

Due to the divide by two nature of the wave shaper 18, divides by odd values to achieve a clock signal X become impossible. In order to divide the clock signal N by 81 to achieve a clock signal X equal to N/81, the divider 16 must divide by 40.5. The divide by 40.5 becomes a divide by 81 when the wave shaper 18 divides by 2. With the illustrated hardware, a divide by 81, or any other odd number, is impossible because output 30 is interpreted as an integer and cannot represent 40.5. Therefore, for divisions by odd numbers or fractions, such as 40.25, a group of least significant bits (LSBs) of the counter 12 can be used to alter the output of the divider 16. In FIG. 1, the six LSBs are connected from counter 12 to divider 16 as additional data inputs. The LSBs that are used by the divider 16 need to be stored in alterable memory for most applications. An LSB 31 can be used to represent a count of 0.5 in the counter 12, and LSB 33 can be used to represent a count of 0.25 in the counter 12, and so on.

If the LSB 31 is zero, the divisor operates as normal and divides by an even number due to the divide by two of the wave shaper 18. If the LSB 31 is a one, the divider 16 is informed that a fractional value of 0.5 is present in the divisor. To implement the 0.5 division of the clock signal X and to result in an overall divide by an odd number, the divider 16 pre-increments the divisor every other time it loads the divisor and starts to decrement. For example, assume as before that output 30 is equal to 40 and that the LSB 31 is a logic one (indicating a 40.5 in the counter 12). The divider 16 will first load a 40 and decrement from 40 to zero, and then will load a 41 and decrement to zero outputting a toggle or spike on output conductor 24 each time it reaches zero. By switching between divisors of 40 and 41 each cycle, a divide by 80 and 82 is respectively preformed to synthesize clock signal X. On the average, this divide will appear to be performing a divide by 81 which is the average of 80 and 82. Therefore if clock signal N is at a frequency greater than before, for example 20.736 MHz, clock signal X will appear to be a clock operating at an average frequency of 256 KHz.

To achieve divides by other fractional values, more LSBs, such as LSB 33, are needed. To divide by a 40.75 in the count, LSB 31 and 33 will be a logic high and the divisor values sequenced through the divider 16 will be 40,41,41, and 41 repeating endlessly. This creates an overall average divide of 81.5 when the wave shaper 18 divide by two is taken into account. Therefore, the clock signal X will have an overall average frequency of 256 KHz which results due to a clock signal N which has a frequency of 20.864 MHz.

With output 28, output 30, decoder 14, and divider 16 configured as described herein, the system clock signal N can have a frequency within a large range of frequencies, have frequency operational variation, and still circuit 10 will produce a clock signal X which has a fixed frequency of roughly 256 KHz with a 50% duty cycle for the first example above. Therefore, operational variation in clock values and different clock frequencies can be applied to circuit 10 and still produce an output clock of 256 KHz without extreme error. It should be noted that by altering the number of bits in the counter 12, by altering the decoding scheme, by increasing or decreasing the number of bits received by the latch/decoder 14 from the counter 12, and by altering the logic in the divider 16, other operational frequency ranges for clock signal N can be achieved that avoid counter 12 overflow so that other fixed frequencies for clock signal X can be achieved.

For example, to demonstrate the ability of circuit 10 to produce a fixed synthesized clock signal X as the system clock signal N is altered, and to demonstrate the ability to pick other fixed clock signal X values, the following tables are given:

TABLE 1

Reference clock signal M = 8 KHz.
Number of MSBs in output 28 is six as in FIG. 1.

| Clock signal N (MHz) | count in counter 12 (counts) | output 30 (counts) | | Clock signal X (KHz) | |
|---|---|---|---|---|---|
| 33 | 4125 | 64 | 64.45 | 257.8 | 256.01 |
| 20.48 | 2560 | 40 | 40 | 256 | 256 |
| 12 | 1500 | 23 | 23.43 | 260.9 | 256.08 |
| 4 | 500 | 7 | 7.81 | 285.7 | 256.08 |
| 1 | 125 | 1 | 1.95 | 500 | 256.41 |

The above table illustrates the use of five different values for the clock signal N while maintaining a constant clock signal M frequency. In Table 1, the number of MSB counter bits taken out of the counter 12 and placed into the latch/decoder 14 is six as in FIG. 1. Clock signal N is placed in the first column above and illustrates the use of 33 MHz, 20.48 MHz, 12 MHz, 4 MHz, and 1 MHz clocks. The counted number of periods of the clock signal N is presented in the second column as the count value for counter 12. The third column, labeled output 30, is derived by taking the value of the top six bits of counter 12 or equivalently by dividing the second column by 64. The first value under output 30 is the integer part, the second value represents the use of LSBs, such as LSB 31 and LSB 33, to create fractions as discussed above. The fourth and final column labeled clock signal X illustrates the clock signal X value that is achieved via circuit 10. The first number of the fourth column assumes no fraction in the output 30 column and the second number assumes two decimal digit precision. Notice that the use of fractions results in improved resolution and accuracy, especially for small clock values wherein fewer bits in the counter are being utilized. A reduced clock signal M frequency along with a larger counter bit-size can fix this resolution error by improving counter 12 precision. A clock of 256 KHz is produced by circuit 10 regardless of the frequency of the system clock N.

The following table is a table that assumes a reference clock signal M frequency of 8 KHz and illustrates what happens if eight MSBs are taken from the count and fed into the decoder 14 and used to produce the output 30 divisor:

TABLE 2

Reference clock signal M = 8 KHz.
Number of MSBs in output 28 is eight, two more bits than illustrated in FIG. 1.

| Clock signal N (MHz) | count in counter 12 (counts) | output 30 (counts) | | Clock signal X (KHz) | |
|---|---|---|---|---|---|
| 33 | 4125 | 257 | 257.8 | 64.2 | 64.00 |
| 20.48 | 2560 | 160 | 160 | 64 | 64.00 |
| 12 | 1500 | 93 | 93.75 | 64.5 | 64.00 |
| 4 | 500 | 31 | 31.25 | 64.5 | 64.00 |
| 1 | 125 | 7 | 7.81 | 71.4 | 64.02 |

By varying the percentage and location of the bits passed from the counter 12 to the decoder 14 the frequency setpoint for clock signal X has changed from 256 KHz to 64 KHz. Other clocks that are not power of two multiples of the clock signal M are possible via the use of decoding schemes in the decoder 14, or fractions in the counter 12. As illustrated above, more bits being passed from the counter 12 to the decoder 14 results in better resolution and therefore a clock signal X that is closer to the desired clock signal. As in Table 1, Table 2 has two values in the columns labeled output 30 and clock signal X. The two values are used to illustrate the difference between using fractional LSB portions of the counter 12 versus using only integer MSB portions of counter 12.

In systems where exact frequencies are needed to ensure proper operation, such as filters, the divider 16 can be synchronized or restarted via a starting point of a period of the clock signal M. This synchronization will remove the error observed in the fourth columns listed in each of the above tables. If a 256 KHz clock is desired, a 256 KHz clock will result by altering the duty cycle of a period of the clock signal X when a period of the clock signal M begins.

Figure 3:
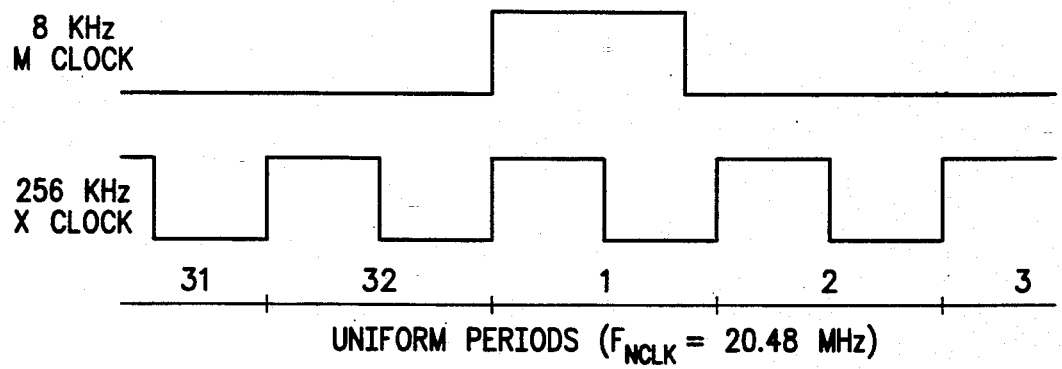
FIG. 3 illustrates a timing diagram of a synthesized output clock synchronized by a reference clock and having uniform periods which are synthesized by the frequency synthesizer of FIG. 1.

Illustrated in FIG. 3 is an ideal, 50% duty cycle, square wave clock signal X which occurs if clock signal N is a power of two multiple of the clock signal M. This is illustrated numerically in the above tables via the clock signal N value of 20.48 MHz. The waveform for an ideal clock is illustrated in FIG. 3 having uniform periods. For the given frequencies, each period or cycle of the clock signal M is equal in time to thirty-two periods of the clock signal X. In FIG. 3 the 256 KHz clock signal X has no duty cycle error because the clock signal N is a perfect multiple of the clock signal M. In other words no fraction is contained in the counter 12 (the counter LSBs are zero) and output 30 is an integer value. The divider 16, when reset and synchronized by the 8 KHz signal, produces a clean 50% duty 256 KHz waveform as if the synchronization was not present or needed. $F_{Nclk}$ indicates the frequency of clock signal N which is the system clock signal.

Figure 4:
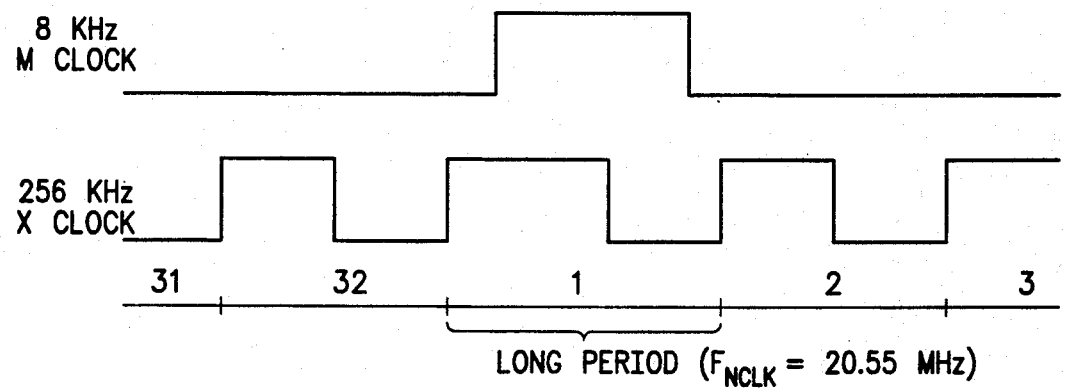
FIG. 4 illustrates a timing diagram of the synthesized output clock synchronized by a reference clock and having a first type of operational variation synthesized by the frequency synthesizer of FIG. 1.

FIG. 4 illustrates a case wherein the divider 16 is synchronized by the 8 KHz clock signal M, no fractional component is taken from the counter 12, and the frequency of clock signal X is slightly greater than the target frequency of 256 KHz due to operational variation. The case of FIG. 4 is also illustrated numerically by the clock signal N of 33 Mhz in the above tables. A long period results for one of the thirty-two clock signal X periods that occur within the clock signal M period. It is important to note that the clock signal X, although altered in duty cycle, maintains a frequency of 256 KHz. The long period therefore compensates for the frequency operational error due to a limited resolution of counter 12 and external control clock tolerances and error. This longer period is a result of the synchronizing of the clock signal X to the clock signal M as illustrated.

Figure 5:
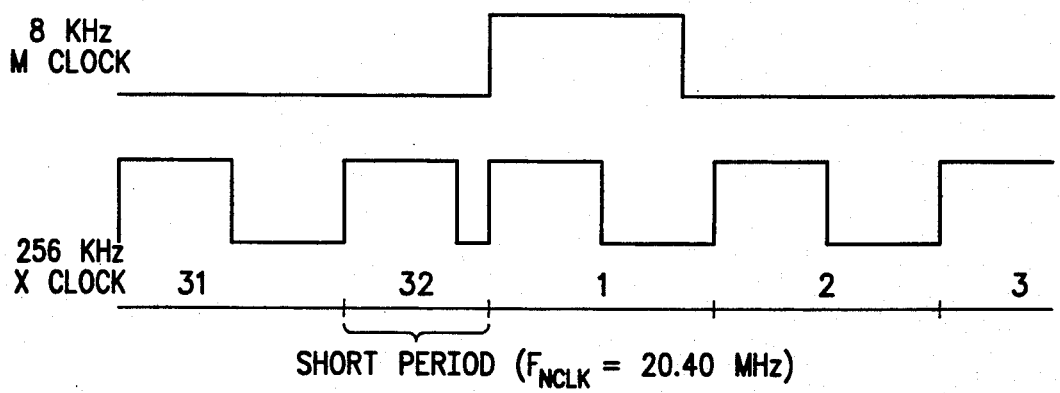
FIG. 5 illustrates a timing diagram of the synthesized output clock synchronized by a reference clock and having a second type of operational variation synthesized by the frequency synthesizer of FIG. 1.

Due to counting errors, operational errors, and/or fluctuations in clock signals N or M during operation, the case illustrated in FIG. 5 could result wherein the frequency of clock signal X is less than the desired freqency of 256 KHz. In this case, synchronization with the clock signal M results in one period of clock signal X being a short period as illustrated. The short period will repeat for every thirty-two cycles of the clock signal X if the operational variations an environment remain constant. Once again, 256 KHz operation is preserved at the expense of alteration in the ideal 50% duty cycle. In some applications, duty cycle is not important whereas frequency of operation is crucial. In those cases this method of sychronization will provide a stable clock signal X frequency regardless of errors, operational variation, and clock signal tolerances.

Another way in which to achieve a wide range of clock values not related by a power of two to the clock signal M is to further decode the output 28 provided by the counter 12. The decoder 14, if functioning as more than a latch or storage device, can produce more flexible divisors but adds circuit overhead and complexity. Due to the circuit overhead and complexity, this method is not a preferred method.

For example, assume a circuit (not illustrate) will use one frequency for clock signal N out of five possible clock frequencies. Assume that these frequencies are: 33 MHz, 20.48 MHz, 12 MHz, 4 MHz, and 1 MHz as indicated before. The latch/decoder 14 can then be instructed via hardware or software that based on these frequencies different divisors should be output to the divider M. To achieve some clock signal X frequencies that are fractional multiples of clock signal M, more bits of precision may be required as a data input to the divider 16 via output 30 and extra count logic (not illustrated) in the divider 16 may be needed to alter the decrementing or operation of the divider 16. For example:

TABLE 3

| Clock signal N (MHz) | count in counter 12 (counts) | output 30 (decode value) |
|---|---|---|
| 33 | 4125 | 82.5 |
| 20.48 | 2560 | 51.2 |
| 12 | 1500 | 30 |
| 4 | 500 | 10 |
| 1 | 125 | 2.5 |

In Table 3, the latch/decoder 14 is programmed to detect the counts for certain predetermined clock signal N frequencies and output a constant 200 KHz clock signal X. Due to the fact that 200 KHz is not a power of two multiple of the reference clock, advanced decoding, which is illustrated above in tabular form, is required.

The counter 12 count value is detected by the latch/decoder 14 as one of the count values of 4125, 2560, 1500, 500, and 125 which respectively represent the clock signal N frequencies of 33 MHz, 20.48 MHz, 12 MHz, 4 MHz, and 1 MHz. Count tolerances for the count values must be allowed for in the latch/decoder 14 logic in order to account for operational variations. Any other count that is detected out of the range of the specified count values and tolerances can generate an error or result in a default clock signal X setting. Once the decoder 14 detects the clock signal N frequency or the count output signal of counter 12, a new binary control value is output from a read only memory (ROM) table or the like to the divider 16 via the output 30. The new binary control value can be referred to and used in the same manner as the previously mentioned divisor. The new binary control value therefore becomes a new divisor and the clock values have been radically changed or decoded from previous examples as illustrated in the table above.

When implementing a clock synthesis circuit, such as circuit 10, resets, circuit delays, synchronization, and circuit operating conditions can result in inherent errors, otherwise known as operational errors. These operation errors include missed count values of clock signal N in the counter 12 during reset, missed decrements in the divider 16 while waiting on synchronization loads or resets, errors due to delays in decoding time, and so on. Usually, these errors are consistent errors. These errors can therefore be compensated for in the counter 12 by presetting the counter 12 to a fixed and predetermined count value instead of resetting counter 12 via the clock signal M. For example, if three clock periods of clock signal N are missed by the counter 12 during reset, then the counter can be preset to three, not reset to zero, via clock signal M to overcome the three cycle error. Many counters are designed with built-in reset or preset logic but external logic (not illustrated) may also be designed to preset counter 12.

It should be noted that various decoding schemes, may be used with the present invention. It is intended in the appended claims to cover numerous modifications to circuit 10 that do not depart from the spirit and scope of this invention. For example, the reference clock signal M and the system clock signal N can vary greatly in frequency and origin. The counter 12 can have many implementations and be of any bit-size. The output 28 of the counter 12 is not limited to a specific number of bits and is therefore unlimited in bandwidth. The latch/decoder 14 can vary from a simple memory device such as a latch to a complex decoder requiring more memory and/or circuitry. The output 30 is not limited to any one bandwidth. The programmable divider 16 has many implementations and can have many additional features and still perform a division of the clock signal N in some manner. The wave shaper 18, although not always necessary for circuit 10 operation, is a flexible circuit that affects either duty cycle and/or frequency of clock signal X. It is to be understood, therefore, that this invention is not limited to the particular forms illustrated and that it is intended in the appended claims to cover all modifications that do not depart from the spirit and scope of this invention.

I claim:

1. A frequency synthesizer comprising:
    a counter having a reference clock input for receiving a reference clock signal, a system clock input for receiving a system clock signal which has a frequency which is externally controlled to be within a predetermined range of frequencies greater than a frequency of the reference clock signal and which has operational error, and an output for providing a count output signal;
    means for storing coupled to the counter, for storing a predetermined portion of the count output signal; and
    means for dividing coupled to the means for storing, the means for dividing receiving and dividing the system clock by a divisor determined by the predetermined portion of the count output signal to provide a synthesized output frequency signal of predetermined constant frequency regardless of variation of the system clock within the predetermined range of frequencies.

2. The frequency synthesizer of claim 1 wherein the means for storing further decodes the predetermined portion of the count output signal to modify a binary value of the predetermined portion of the count output signal.

3. The frequency synthesizer of claim 1 wherein the means for storing also decodes the predetermined portion of the count output signal to provide a binary control value for controlling the means for dividing.

4. The frequency synthesizer of claim 1 wherein the predetermined constant frequency has a value which is a power of two multiple of a frequency of the reference clock signal.

5. The frequency synthesizer of claim 1 wherein the predetermined range of frequencies is substantially between 1 MHz and 33 MHz.

6. The frequency synthesizer of claim 1 wherein the counter is preset to a predetermined count value for establishing a reset condition.

7. The frequency synthesizer of claim 1 further comprising waveform signal shaping means coupled to the means for dividing to modify a duty cycle of the synthesized output frequency signal in a predetermined manner.

8. The frequency synthesizer of claim 7 wherein the waveform signal shaping means divides the synthesized output frequency signal by a power of two.

9. The frequency synthesizer of claim 1 wherein the means for dividing uses a fractional value output from the counter to achieve a synthesized output frequency signal that is a fractional multiple of the reference clock signal.

10. The frequency synthesizer of claim 1 wherein the counter is preset with a count value which modifies the predetermined portion of the count output signal to compensate for inherent error in the counter and the means for dividing.

11. The frequency synthesizer of claim 1 wherein the means for dividing is synchronized to the reference clock signal to remove frequency error in the system clock input.

12. The frequency synthesizer of claim 1 wherein the means for dividing further comprises means for synchronizing operations with the reference clock signal.

13. A method of frequency synthesis comprising the steps of:
    providing a system clock signal with a system clock frequency which varies within a predetermined range of frequencies;
    providing a reference clock signal with a frequency that is less than the system clock frequency;
    counting a number of system clock signal periods within a period of the reference clock signal, the counting being stored in a count value;
    dividing the count value by a number which is a positive power of two to produce a modified count;
    decoding the modified count value to provide a divisor value; and
    dividing the system clock signal by the divisor value to provide a synthesized clock output of predetermined constant frequency regardless of variation in the system clock signal within the predetermined range of frequencies.

14. The method of claim 13 wherein the step of providing the reference clock signal further comprises deriving the reference clock signal from the system clock signal.

15. The method of claim 13 wherein the step of decoding the modified count only consists of storing the count value in an alterable memory.

16. A frequency synthesizer comprising:
- a binary counter having a reference clock input for receiving a reference clock signal which has a frequency that varies within a first predetermined frequency range, a system clock input for receiving a system clock signal which has a frequency that varies within a second predetermined frequency range which is greater than the frequency of the reference clock, and an output for providing a binary count output signal;
- alterable memory coupled to the counter for storing a predetermined portion of the binary count output signal as a divisor; and
- a divider circuit coupled to the alterable memory for dividing the system clock signal by the divisor stored in the alterable memory to provide a synthesized output frequency signal of predetermined constant frequency regardless of variation of the system clock signal within the second predetermined frequency range, the predetermined constant frequency being less than the frequency of the system clock signal and greater than the frequency of the reference clock signal.

17. The frequency synthesizer of claim 16 wherein the alterable memory further decodes the predetermined portion of the binary count output signal to determine the divisor for the divider circuit.

18. The frequency synthesizer of claim 16 wherein the alterable memory is preset to a predetermined count value for establishing a reset condition.

19. The frequency synthesizer of claim 16 further comprising waveform signal shaping means coupled to the divider circuit to modify a duty cycle of the synthesized output frequency signal in a predetermined manner.

20. The frequency synthesizer of claim 16 wherein the divider circuit uses a fractional value output from the alterable memory to achieve a synthesized output frequency signal that is a fractional multiple of the reference clock signal.

* * * * *